(12) United States Patent
Yang

(10) Patent No.: US 9,520,866 B2
(45) Date of Patent: Dec. 13, 2016

(54) DELAY ADJUSTING APPARATUS AND OPERATING APPARATUS INCLUDING THE SAME

(71) Applicant: SK hynix Inc., Icheon-si Gyeonggi-do (KR)

(72) Inventor: Sun Suk Yang, Seongnam-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/637,075

(22) Filed: Mar. 3, 2015

(65) Prior Publication Data

US 2016/0118969 A1 Apr. 28, 2016

(30) Foreign Application Priority Data

Oct. 28, 2014 (KR) .................. 10-2014-0147540

(51) Int. Cl.
*H03K 5/13* (2014.01)
*H03K 5/134* (2014.01)
*H03K 5/00* (2006.01)

(52) U.S. Cl.
CPC ..... *H03K 5/134* (2014.07); *H03K 2005/00071* (2013.01); *H03K 2005/00215* (2013.01)

(58) Field of Classification Search
CPC ...... H03K 5/13; H03K 19/00; H03K 19/0175; H03K 3/011; H03K 3/015; H03K 5/06; H03K 5/131; H03K 5/1565

USPC .................. 327/108, 115, 156, 161, 142, 175
See application file for complete search history.

(56) References Cited

U.S. PATENT DOCUMENTS

| | | | |
|---|---|---|---|
| 7,489,587 B2 * | 2/2009 | Bell .................. | G11C 7/22 327/149 |
| 2003/0123597 A1 | 7/2003 | Cho | |
| 2007/0165474 A1 * | 7/2007 | Kim .................. | G11C 7/02 365/208 |

FOREIGN PATENT DOCUMENTS

KR 1020030056461 A 7/2003

\* cited by examiner

*Primary Examiner* — John Poos
(74) *Attorney, Agent, or Firm* — William Park & Associates Ltd.

(57) ABSTRACT

A delay adjusting apparatus may include at least one selective delay element electrically coupled to an electrical path between an input terminal and an output terminal of the electrical path, and the at least one selective delay element configured to add a delay factor to the electrical path in response to an enable signal. The delay adjusting apparatus may include at least one fuse circuit configured to control electrical coupling of an e-fuse, in response to a program signal, and program the enable signal.

16 Claims, 7 Drawing Sheets

DELAY ADJUSTING APPARATUS AND OPERATING APPARATUS INCLUDING THE SAME

CROSS-REFERENCES TO RELATED APPLICATION

The present application claims priority under 35 U.S.C. §119(a) to Korean application number 10-2014-0147540, filed on Oct. 28, 2014, in the Korean Intellectual Property Office, which is incorporated herein by reference in its entirety.

BACKGROUND

1. Technical Field

Various embodiments generally relate to a delay adjusting apparatus and an operating apparatus including the same, and more particularly, to a delay adjusting apparatus including fuses and may adjust a delay even after packaging and an operating apparatus including the same.

2. Related Art

An electronic device may be manufactured by packaging various operating apparatuses. A plurality of operating apparatuses may be mounted at different positions in the electronic device. The time taken for certain signal to reach the various operating apparatuses may be different according to the different mounting positions of the various operating apparatuses. As such, it may be necessary to adjust delay amounts.

Also, delay adjustments may be made for the operating apparatuses according to the circuit characteristics of a device in which the operating apparatuses are packaged.

SUMMARY

In an embodiment, a delay adjusting apparatus may include at least one selective delay element electrically coupled to an electrical path between an input terminal and an output terminal of the electrical path, and the at least one selective delay element configured to add a delay factor to the electrical path in response to an enable signal. The delay adjusting apparatus may include at least one fuse circuit configured to control electrical coupling of an e-fuse, in response to a program signal, and program the enable signal.

In an embodiment, an operating apparatus may include at least one delay adjusting apparatus configured to control electrical coupling of an e-fuse, based on a program signal, and program an enable signal, and adjust a delay time of an input signal in response to the programmed enable signal and output an output signal. The operating apparatus may include a program control circuit configured to generate the program signal to adjust the delay time.

DETAILED DESCRIPTION

Hereinafter, a delay adjusting apparatus and an operating apparatus including the same will be described below with reference to the accompanying drawings through various examples of embodiments.

Various embodiments may be directed to a delay adjusting apparatus for adjusting a signal delay amount after packaging has occurred, and an operating apparatus including the same.

Various embodiments may be directed to a delay adjusting apparatus for adjusting a signal delay amount by using fuses and an operating apparatus including the same.

According to various embodiments, the delay adjusting apparatus and the operating apparatus including the same may adjust the delay amount of an internal signal according to a signal applied from an exterior. Therefore, a delay time may be applicably adjusted after the manufacture of an apparatus. Accordingly, the operational reliability of each operating apparatus may be improved when mounted to an electronic device.

Figure 1:
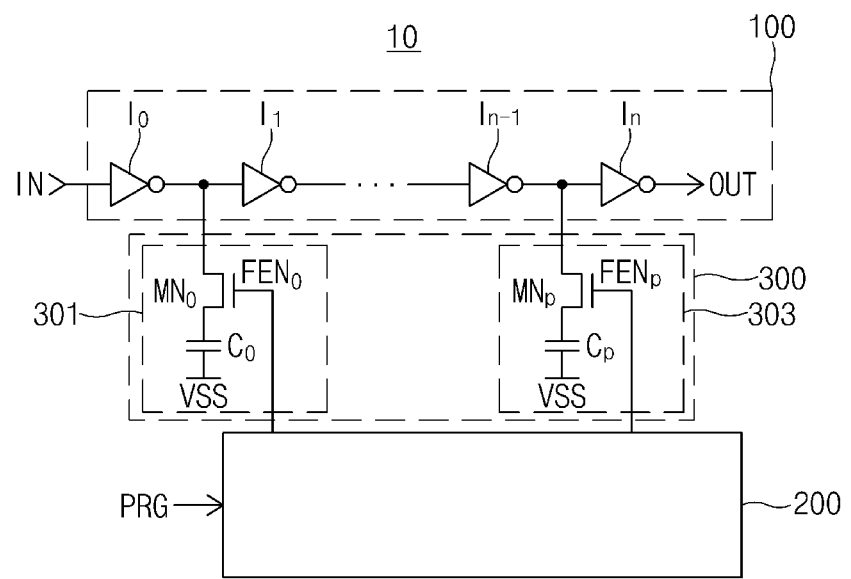
FIG. 1 is a diagram illustrating a representation of an example of a delay adjusting apparatus in accordance with an embodiment.

FIG. 1 is a diagram illustrating a representation of an example of a delay adjusting apparatus in accordance with an embodiment.

Referring to FIG. 1, a delay adjusting apparatus 10 may include an electrical path 100, at least one fuse circuit block 200, and a selective delay element block 300.

The electrical path 100 may correspond to the electrical path electrically coupled between an input terminal and an output terminal. An input signal IN may be applied through the input terminal. An output signal OUT may be outputted through the output terminal. A plurality of inverters $I_0$, $I_1$, ..., $I_{n-1}$ and $I_n$ may be included in the electrical path 100.

The selective delay element block 300 may be realized to include one or more selective delay elements 301, ... and 303. The respective selective delay elements 301, ... and 303 may be electrically coupled to the electrical path 100, and may add delay factors such as, for example but not limited to, capacitor components $C_0$, ... and $C_p$ to the electrical path 100 in response to enable signals $FEN_0$, ... and $FEN_p$.

The first selective delay element 301 may include a first transistor MN0, and the first capacitor component $C_0$. The first transistor MN0 may include a first terminal electrically coupled with the node between the first inverter $I_0$ and the second inverter $I_1$ of the electrical path 100. The first transistor MN0 may include a second terminal electrically coupled with the first capacitor component $C_0$. The first transistor MN0 may include a gate terminal applied with the first enable signal $FEN_0$. The first capacitor component $C_0$ may be electrically coupled between the second terminal of the first transistor MN0 and a ground voltage VSS.

If the first enable signal $FEN_0$ is enabled and the first capacitor component $C_0$ is added to the electrical path 100, the delay time between the input signal IN and the output signal OUT may be lengthened when compared to not enabling the first enable signal $FEN_0$ and not adding the first capacitor component $C_0$ to the electrical path 100. If the first enable signal $FEN_0$ is disabled, since a separate delay factor is not added to the electrical path 100, the delay time between the input signal IN and the output signal OUT is not lengthened.

Accordingly, the delay time between the input signal IN and the output signal OUT is determined according to the amount of delay factors from the selective delay element block 300 are added to the electrical path 100.

The fuse circuit block 200 programs the enable signals $FEN_0, \ldots$ and $FEN_p$ by controlling electrical coupling of e-fuses, based on a program signal PRG applied from an exterior of the fuse circuit 200 or the delay adjusting apparatus 10. The program signal PRG applied from an exterior may include a plurality of signals, and descriptions for the plurality of signals will be made below with reference to FIG. 2 and so forth.

The fuse circuit block 200 may generate the respective enable signals $FEN_0, \ldots$ and $FEN_p$, based on the program signal PRG. Similar to the selective delay element block 300, the fuse circuit block 200 may include one or more fuse circuits for providing the enable signals $FEN_0, \ldots$ and $FEN_p$ to the respective selective delay elements 301, . . . and 303.

Figure 2:
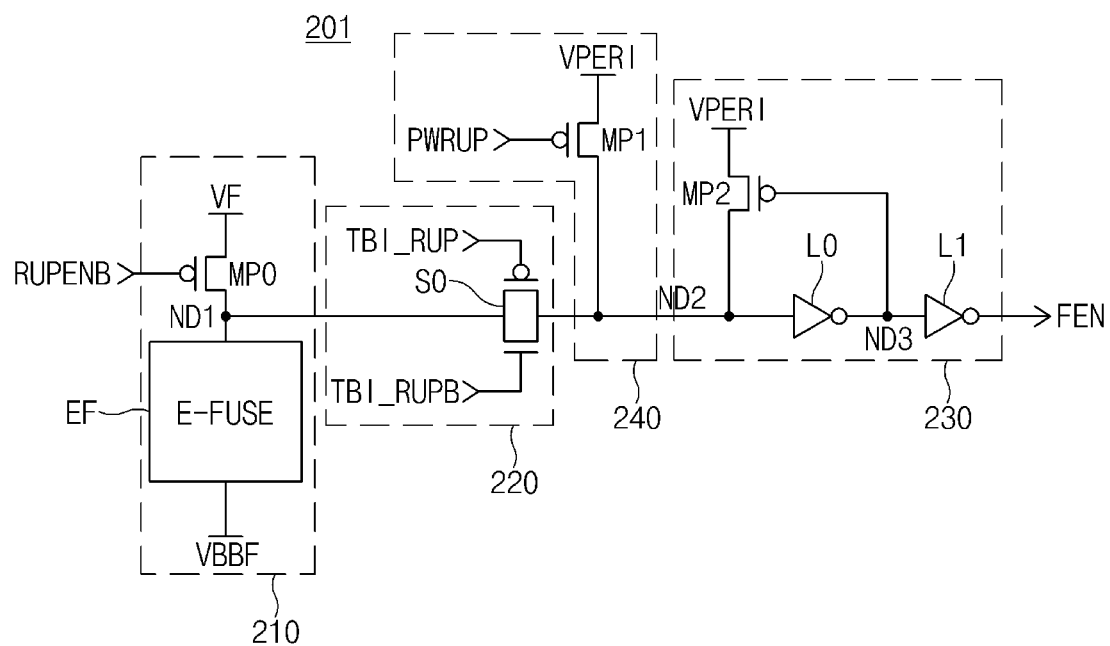
FIG. 2 is a circuit diagram illustrating a representation of an example of one fuse circuit included in the fuse circuit block illustrated in FIG. 1.

FIG. 2 is a circuit diagram illustrating a representation of an example of one fuse circuit included in the fuse circuit block illustrated in FIG. 1. A fuse circuit block may include multiple fuse circuits.

A fuse circuit 201 may include a programming unit 210, a path control unit 220, and a latch unit 230.

The programming unit 210 applies a first voltage VF and a second voltage VBBF to both terminals of an e-fuse EF in response to a rupture enable signal RUPENB. The rupture enable signal RUPENB may be included in the program signal PRG.

In the examples where the rupture enable signal RUPENB is disabled, since one terminal of the e-fuse EF, that is, a first node ND1 is a floating state, only the second voltage VBBF is applied to the e-fuse EF, or, although an electrical field by the difference of a peripheral voltage VPERI and the second voltage VBBF is applied to the e-fuse EF when the voltage of the first node ND1 corresponds to the peripheral voltage VPERI, the e-fuse EF is not shorted by such a voltage difference.

If the rupture enable signal RUPENB is enabled, as the first voltage VF and the second voltage VBBF are applied, a high voltage difference may be induced in both terminals of the e-fuse EF. In particular, in the fuse circuit 201 in accordance with an embodiment, the difference between the first voltage VF and the second voltage VBBF may be increased before the rupture enable signal RUPENB is enabled, such that an electric field enough to short the e-fuse EF may be applied to the e-fuse EF.

The programming unit 210 may include a first PMOS transistor MP0 including a first terminal electrically coupled with the first node ND1, a second terminal applied with the first voltage VF and a gate terminal applied with the rupture enable signal RUPENB. The programming unit 210 may include the e-fuse EF including one terminal electrically coupled with the first node ND1 and the other terminal electrically coupled with the second voltage VBBF.

The path control unit 220 may electrically couple or decouple the path between the programming unit 210 and the latch unit 230 in response to a path signal TBI_RUP. The path signal TBI_RUP may be included in the program signal PRG. The path control unit 220 may electrically couple or decouple the path between the first node ND1 and a second node ND2.

In a general operating situation, the path control unit 220 electrically couples the first node ND1 and the second node ND2, and provides the signal provided from the programming unit 210, to the latch unit 230.

In the examples of programming the e-fuse EF, the path control unit 220 electrically decouples the path between the programming unit 210 and the latch unit 230, such that the electric field according to the difference of the first voltage VF and the second voltage VBBF may be applied to only the e-fuse EF.

According to an embodiment, the path control unit 220 may include a transfer gate S0 such as a switching element, which electrically couples the path between the first node ND1 and the second node ND2 in response to the path signal TBI_RUP and an inverted path signal TBI_RUPB.

The latch unit 230 temporarily stores the voltage level provided from the programming unit 210 through the path control unit 220, and provides a stored value as an enable signal FEN.

Referring to FIG. 2, in order for general description for one fuse circuit 201, the term, enable signal FEN capable of including the first enable signal $FEN_0, \ldots$ or the $(p+1)^{th}$ enable signal $FEN_p$ is used.

According to an embodiment, the latch unit 230 may include a first inverter L0 and a second inverter L1 which are electrically coupled to the output terminal of the path control unit 220, and a third PMOS transistor MP2 including a first terminal electrically coupled with the second node ND2, a second terminal applied with the peripheral voltage VPERI and a gate terminal electrically coupled with the output terminal of the first inverter L0, that is, a third node ND3.

The third PMOS transistor MP2 is turned on in the example where the voltage provided from the path control unit 220 is a logic high state, that is, the voltage provided from the first inverter L0 in correspondence to the peripheral voltage VPERI is a logic low state. As the third PMOS transistor MP2 is turned on, the output terminal of the path control unit 220 retains the peripheral voltage VPERI as it is, and the value of the peripheral voltage VPERI is stored.

Conversely, in the example where the voltage provided from the path control unit 220 is a logic low state, the third PMOS transistor MP2 is turned off, and the latch unit 230 outputs the value provided from the path control unit 220 as it is, as the enable signal FEN.

As will be described later, in the state in which the e-fuse EF is not programmed, the fuse circuit 201 in accordance with an embodiment provides the enable signal FEN corresponding to a logic high state, and the latch unit 230 turns on the third PMOS transistor MP2 and retains the voltage value thereof.

If the e-fuse EF is programmed, since a voltage corresponding to a logic low state is continuously provided through the path control unit 220, it may not be necessarily required to store a value, and the same voltage as the voltage of the first node ND1 is provided as the enable signal FEN.

Therefore, while a general latch circuit is realized by two or more inverters, the latch unit 230 in accordance with an embodiment may effectively store the value of the enable signal FEN while minimizing the number of component elements.

According to an embodiment, the fuse circuit 201 may further include a power-up unit 240. The power-up unit 240 serves to initialize the state of the fuse circuit 201 in the state in which power is initially turned on.

If power is turned on, the peripheral voltage VPERI is provided to the second node ND2 which is the output terminal of the path control unit 220 and the input terminal of the latch unit 230, in response to a power-up signal PWRUP. Hence, at an initial stage, the second node ND2 may correspond to a logic high state, and the third node ND3 may correspond to a logic low state. The power-up unit 240 may include a second PMOS transistor MP1 coupled between the peripheral voltage VPERI and the second node ND2, and may have a gate configured to receive the power-up signal PWRUP.

Figure 3:
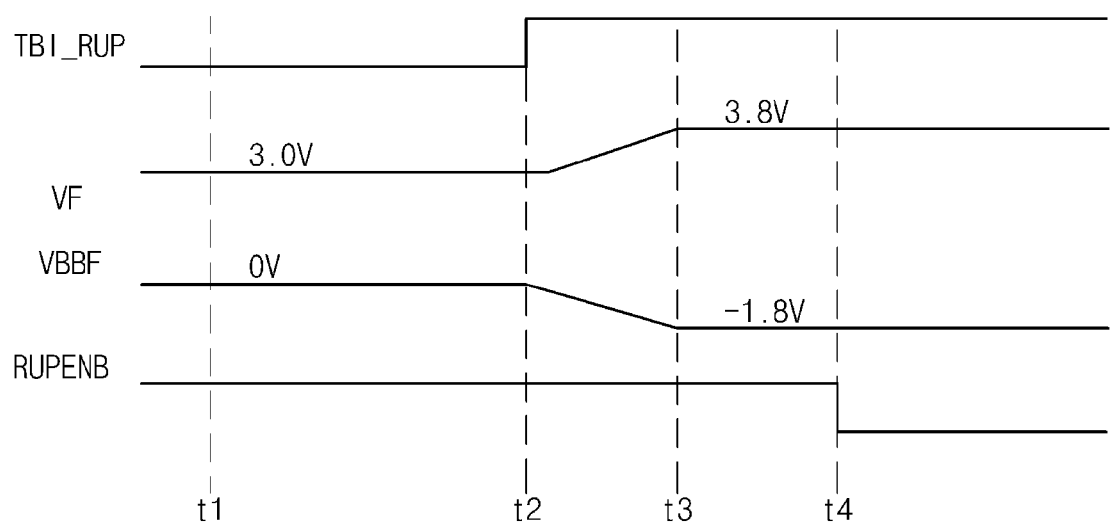
FIG. 3 is a representation of an example of an operation waveform diagram to assist in the explanation of programming of the fuse circuit in accordance with an embodiment.

FIG. 3 is a representation of an example of an operation waveform diagram to assist in the explanation of programming of the fuse circuit in accordance with an embodiment.

Operations for programming the fuse circuit will be described below with reference to FIGS. 2 and 3.

The program signal PRG illustrated in the waveform diagram of FIG. 3 including both the path signal TBI_RUP and the rupture enable signal RUPENB may be provided from a program control circuit. The program control circuit may be disposed outside the delay adjusting apparatus. The program control circuit will be described later with reference to FIG. 5.

At a time t1 as an initial state for programming, the path signal TBI_RUP of a logic low state and the rupture enable signal RUPENB of a logic high state are provided. In this state, the first voltage VF of 3V and the second voltage VBBF of 0V are provided. While descriptions will be made later, the first voltage VF and the second voltage VBBF may be provided from the external program control circuit.

At the time t1, since the second node ND2 already has the value of the peripheral voltage VPERI corresponding to a logic high state by the power-up signal PWRUP, the first node ND1 may also correspond to a logic high state by the path signal TBI_RUP. Further, as the third node ND3 of the fuse circuit 201 corresponds to the logic low state, the enable signal FEN corresponding to the logic high state is outputted.

Because the first PMOS transistor MP0 is turned off by the rupture enable signal RUPENB, the peripheral voltage VPERI and the second voltage VBBF are respectively applied to both terminals of the e-fuse EF. For example, while the peripheral voltage VPERI may have the value of approximately 1.8V and the second voltage VBBF may have the voltage of 0V, the e-fuse EF is not shorted by the difference of the peripheral voltage VPERI and the second voltage VBBF.

At a time t2, the path between the programming unit 210 and the latch unit 230 is shut off by the path signal TBI_RUP.

As the first voltage VF increases and the second voltage VBBF decreases thereafter till a time t3, the difference of the first voltage VF and the second voltage VBBF increases. For example, the value of the first voltage VF increases from 3V to 3.8V, and the value of the second voltage VBBF decreases from 0V to −1.8V. However, since the rupture enable signal RUPENB is not enabled at the time t3, a large electric field enough for the e-fuse EF to be shorted is not formed.

At a time t4, if the first PMOS transistor MP0 is turned on as the rupture enable signal RUPENB is enabled, the first voltage VF and the second voltage VBBF are directly applied to both terminals of the e-fuse EF, respectively. Accordingly, the e-fuse EF receives an electric field corresponding to, for example, 5.6V, and is shorted.

Through this process, the state of the e-fuse EF is changed and the logic state of the enable signal FEN is changed. Then, the rupture enable signal RUPENB is disabled, and programming is completed.

In the fuse circuit 201 in accordance with the embodiment, since the state of the e-fuse EF may be controlled according to a signal applied from an exterior, it is possible to program the enable signal FEN in terms of hardware even after the delay adjusting apparatus 10 is packaged.

Figure 4:
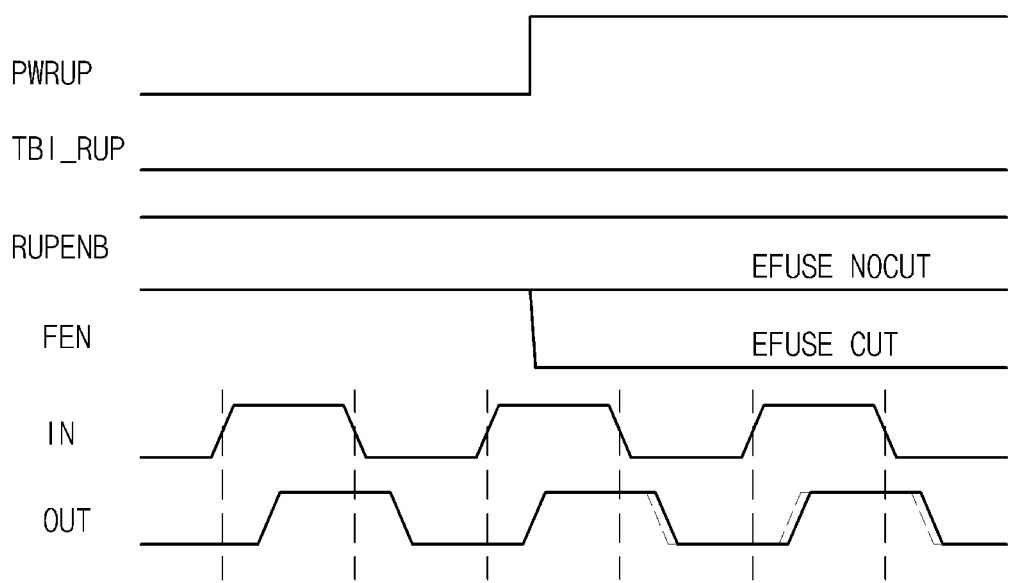
FIG. 4 is a representation of an example of a waveform diagram to assist in the explanation of operations in the normal operation of the fuse circuit in accordance with an embodiment.

FIG. 4 is a representation of an example of a waveform diagram to assist in the explanation of operations in the normal operation of the fuse circuit in accordance with an embodiment.

Referring to FIG. 4, the path signal TBI_RUP electrically couples the first node ND1 and the second node ND2 in correspondence to the logic low state thereof. The rupture enable signal RUPENB turns off the first PMOS transistor MP0 in correspondence to the logic high state thereof.

Since the power-up signal PWRUP is a logic low state, the value of the second node ND2 is set to the peripheral voltage VPERI, and accordingly, the first node ND1 also has the value of the peripheral voltage VPERI and the third node ND3 has a value corresponding to the logic low state.

In this state, if the power-up signal PWRUP becomes a logic high state, that is, if power is applied to the fuse circuit 201, the voltage of the first node ND1 is provided to the second node ND2 as it is.

In the example where the e-fuse EF is not programmed, the peripheral voltage VPERI corresponding to the logic high state the same as the initial state of the first node ND1 is provided as the enable signal FEN as it is. Conversely, If the e-fuse EF is programmed, the second voltage VBBF is provided to the first node ND1, and accordingly, the first node ND1 has the second voltage VBBF, that is, the same level as the ground voltage VSS, and the voltage of the second node ND2 also decreases. As the third node ND3 has a value that results as the logic state of the second node ND2 is inverted by the first inverter L0, the third PMOS transistor MP2 is turned off, and the enable signal FEN of a logic low state is provided through the second inverter L1.

Therefore, the enable signal FEN of different logic states may be provided according to whether the e-fuse EF is programmed or not. If the e-fuse EF included in the fuse circuit 201 is programmed, as the enable signal FEN has a value corresponding to the logic low state, the delay factor $C_0, \ldots$ or $C_p$ added to the electrical path 100 of the delay adjusting apparatus 10 may be removed. Therefore, it may be understood that the e-fuse EF is programmed to shorten the delay time of the input signal IN.

As a consequence, when observing that the input signal IN is provided as the output signal OUT, a delay time is shortened in the example where the e-fuse EF is programmed (EFUSE CUT), as indicated by the dotted lines. This is because the number of delay factors added to the electrical path 100 of the delay adjusting apparatus 10 is decreased.

Conversely, in the example where the e-fuse EF is not programmed (EFUSE NOCUT), the output signal OUT having the same delay time as that prior to the programming of a fuse circuit is provided.

Figure 5:
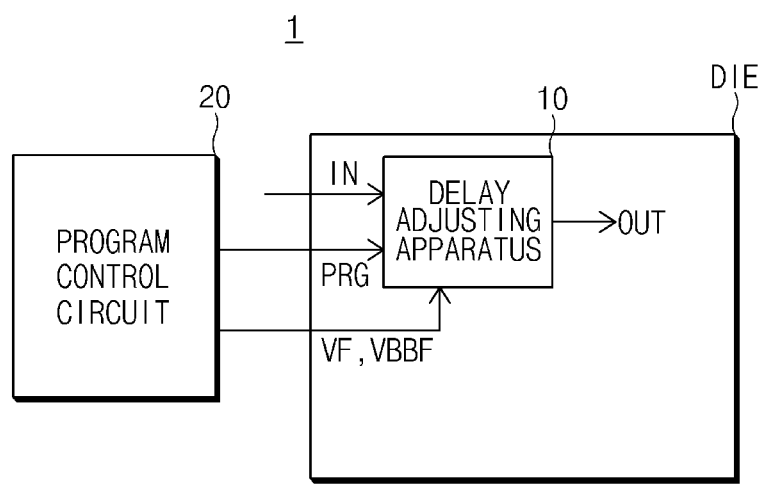
FIG. 5 is a block diagram illustrating a representation of an example of an operating apparatus in accordance with an embodiment.

FIG. 5 is a block diagram illustrating a representation of an example of an operating apparatus in accordance with an embodiment.

Referring to FIG. 5, an operating apparatus 1 may include the delay adjusting apparatus 10 and a program control circuit 20.

The delay adjusting apparatus 10 may program the enable signal FEN by controlling the electrical coupling of the e-fuse EF based on the program signal PRG. The delay adjusting apparatus 10 controls the delay time of the input signal IN in response to the enable signal FEN which is programmed, and provides the output signal OUT.

The delay adjusting apparatus 10 may be realized to have the same configuration as described above with reference to FIGS. 1 and 2, and may perform the same operations as described above with reference to FIGS. 3 and 4.

The program control circuit 20 may generate the program signal PRG to adjust a delay time. The program signal PRG may include the path signal TBI_RUP and the rupture enable signal RUPENB.

According to an embodiment, the program control circuit 20 may generate and provide the first voltage VF and the second voltage VBBF which are to be provided to the fuse circuit block 200 of the delay adjusting apparatus 10.

The program control circuit 20 may generate the program signal PRG, the first voltage VF and the second voltage VBBF according to the packaging characteristic of at least one of the delay adjusting apparatus 10 and the program control circuit 20. For example, the packaging characteristic may be determined according to the disposition characteristic of each of a plurality of dies in which a plurality of delay adjusting apparatuses are realized, in a package. Further, the packaging characteristic may be determined according to the material characteristic of a substrate to be packaged or the characteristic of metal lines which are to be provided with signals through packaging.

According to an embodiment, the delay adjusting apparatus 10 may be formed on one die DIE, adjust the delay time of the input signal IN received through an external pin, and provide the output signal OUT, such that the output signal OUT may be provided to other component elements on the die DIE.

According to an embodiment, the program control circuit 20 may be realized outside the die DIE on which the delay adjusting apparatus 10 is mounted, and the operating apparatus 1 may be packaged into one package. Moreover, in an embodiment, the delay adjusting apparatus 10 may be packaged, and the program control circuit 20 may be realized outside a package.

While illustrated in FIG. 5 that the operating apparatus 1 includes one delay adjusting apparatus 10, it is to be noted that delay adjusting apparatuses 10 respectively formed on a plurality of dies may be included in the operating apparatus 1 and the program control circuit 20 may provide the program signal PRG, the first voltage VF and the second voltage VBBF such that the delay adjusting apparatuses 10 may provide output signals OUT with different delay times for the respective dies.

According to an embodiment, the program control circuit 20 may perform operations according to a program mode and a normal mode, based on an operation mode signal applied from an external device such as a host.

In an embodiment, the program control circuit 20 may not be applied with a signal determining an operation mode, from an exterior, but may perform a programming operation for only a fuse circuit 201 which is to perform programming.

Hereinbelow, the two modes will be described assuming that operations are performed according to a corresponding mode.

The program mode or a programming operation is performed in the same manner as described above with reference to FIG. 3. That is to say, the program mode is an operation for rupturing and thereby programming the e-fuse EF included in the delay adjusting apparatus 10.

In the program mode, the program control circuit 20 shuts off the path between the programming unit 210 and the latch unit 230 by transitioning the path signal TBI_RUP to the logic high state in the fuse circuit 201 which is set to the initial state according to the power-up signal PWRUP.

After shutting off the path between the programming unit 210 and the latch unit 230, the program control circuit 20 gradually increases the difference between the first voltage VF and the second voltage VBBF, and enables the rupture enable signal RUPENB to the logic low state. Due to this process, the first voltage VF is applied to the e-fuse EF, and the e-fuse EF is ruptured by an increased electric field. After the e-fuse EF is ruptured, the program control circuit 20 disables the rupture enable signal RUPENB to the logic high state and ends the program mode.

The program control circuit 20 may operate according to a normal operation based on a signal provided from the external device such as a host, or may perform a normal operation not in the program mode but in a normal situation.

In the normal operation, the program control circuit 20 electrically couples the programming unit 210 and the latch unit 230 by causing the path signal TBI_RUP to correspond to the logic low state. Also, the program control circuit 20 may prevent the first voltage VF from being applied to the e-fuse EF, by causing the rupture enable signal RUPENB to correspond to the logic high state.

Accordingly, in the normal operation, the enable signal FEN may be provided according to a program state of the e-fuse EF, by the path extending through the first node ND1, the second node ND2 and the third node ND3.

In the examples where the e-fuse EF is programmed, since the first node ND1 is electrically coupled to the second voltage VBBF, the enable signal FEN corresponding to the logic low state is provided. Conversely, in the examples where the e-fuse EF is not programmed, the first node ND1 has the peripheral voltage VPERI in the same manner as in the initial state, and the enable signal FEN corresponding to the logic high state is provided.

Figure 6A:
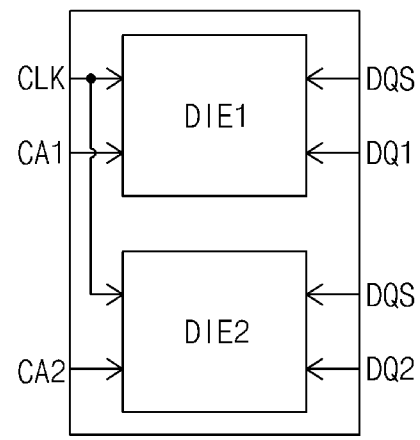
FIGS. 6A and 6B are diagrams illustrating representations of examples in which dies including the operating apparatus in accordance with an embodiment are packaged.
Figure 6B:
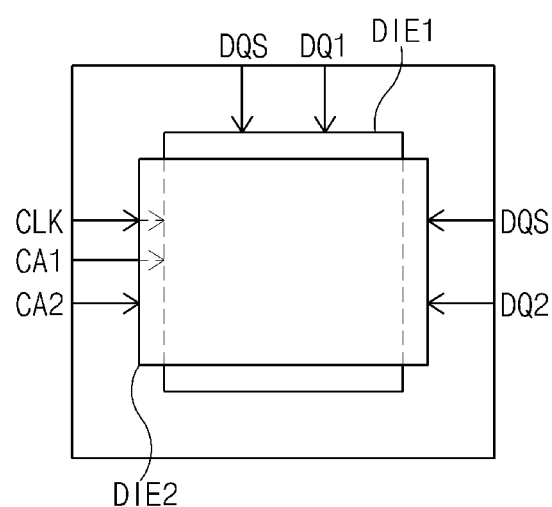

FIGS. 6A and 6B are diagrams illustrating representations of examples in which dies including the operating apparatus 1 in accordance with an embodiment are packaged.

Referring to FIG. 6A, a first die DIE1 and a second die DIE2 each including the operating apparatus 1 in accordance with the embodiments are disposed on one substrate.

The first die DIE1 determines the value of a first command address signal CA1 in synchronization with a clock signal CLK, and determines the value of first input/output data DQ1 in response to a data strobe signal DQS. Similarly, the second die DIE2 determines the value of a second command address signal CA2 in synchronization with the clock signal CLK, and determines the value of second input/output data DQ2 in response to the data strobe signal DQS.

In the example of the data strobe signal DQS and the respective input/output data DQ1 and DQ2, times at which they reach the respective dies DIE1 and DIE2 are not substantially different. However, a time at which the clock signal CLK reaches the first die DIE1 and a time at which the clock signal CLK reaches the second die DIE2 may be different, and accordingly, the second command address CA2 may be strobed according to the clock signal CLK delayed when compared to the example of the first command address signal CA1.

Therefore, in the example where the dies DIE1 and DIE2 are packaged as illustrated in FIG. 6A, it may be necessary to increase the delay time of the second command address signal CA2 in the second die DIE2 or decrease the delay time of the first command address signal CA1 in the first die DIE1.

Referring to FIG. 6B, packaging is performed in such a manner that a second die DIE2 is stacked on a first die DIE1.

Times at which a first data input/output signal DQ1 and a data strobe signal DQS reach the first die DIE1 and times at which a second data input/output signal DQ2 and the data strobe signal DQS reach the second die DIE2 are not substantially different.

Further, times at which a first command address signal CA1 and a clock signal CLK reach the first die DIE1 and times at which a second command address signal CA2 and the clock signal CLK reach the second die DIE2 may not be substantially different when compared to the example of FIG. 6A.

As is apparent from the above descriptions, the delay adjusting apparatus 10 and the operating apparatus 1 including the same in accordance with the embodiments may be used in the example where it is necessary to differently adjust a time by which a signal is to be delayed, according to a characteristic of a package after packaging.

The delay adjusting apparatus 10 in accordance with the embodiments includes the e-fuse EF, and adjusts the delay time of a signal in conformity with a packaging characteristic, according to the program signal PRG and the voltages VF and VBBF. The voltages VF and VBBF may be provided from an exterior.

In addition, the operating apparatus 1 in accordance with the embodiment may applicably adjust a delay time because it is possible to provide the program signal PRG and the voltages VF and VBBF together, which allow the delay time of a signal to be adjusted in conformity with a packaging characteristic, to the delay adjusting apparatus 10 including the e-fuse EF.

Figure 7:
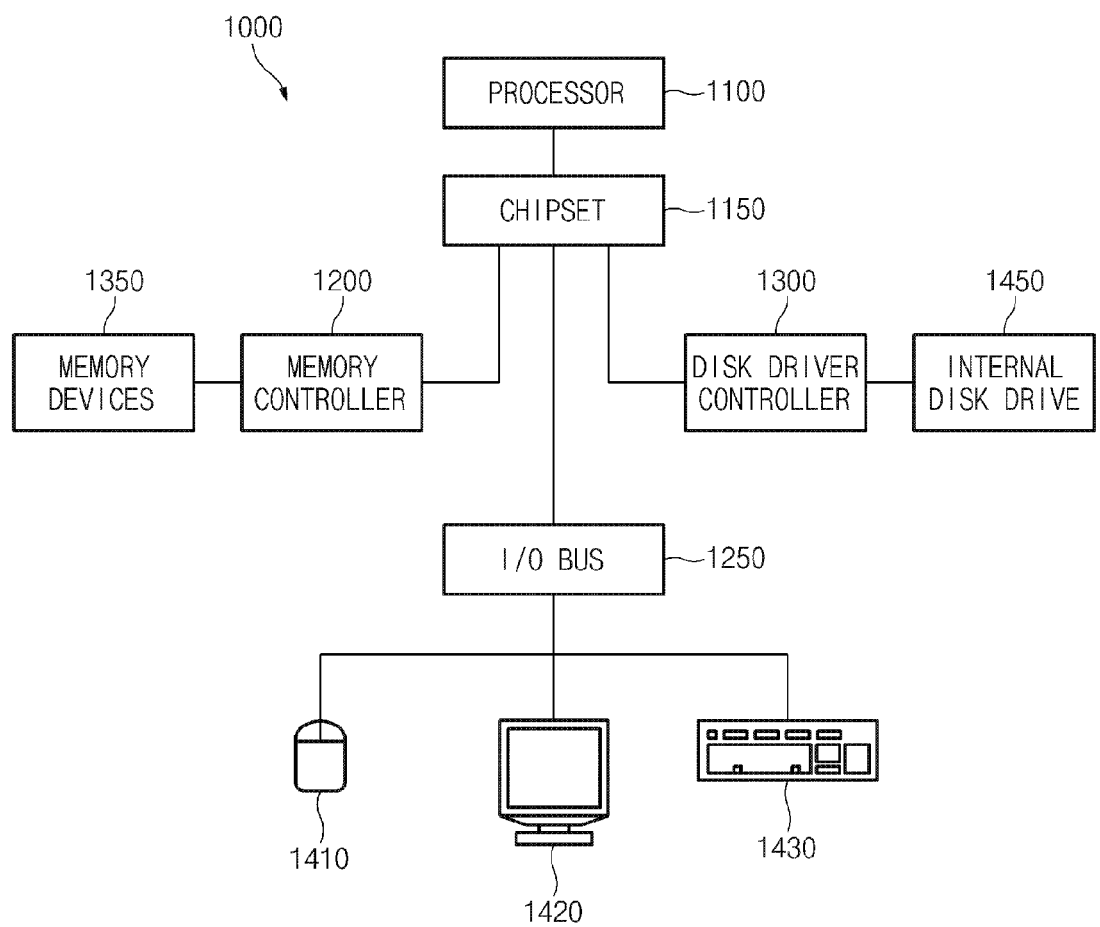
FIG. 7 illustrates a block diagram of an example of a representation of a system employing the delay adjusting apparatus in accordance with the embodiments discussed above with relation to FIGS. 1-6B.

The delay adjusting apparatuses discussed above (see FIGS. 1-6B) are particular useful in the design of memory devices, processors, and computer systems. For example, referring to FIG. 7, a block diagram of a system employing the delay adjusting apparatus in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one delay adjusting apparatus as discussed above with reference to FIGS. 1-6B. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one delay adjusting apparatus as discussed above with relation to FIGS. 1-6B, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 7 is merely one example of a system employing the delay adjusting apparatus as discussed above with relation to FIGS. 1-6B. In alternate embodiments, such as cellular phones or digital cameras, the components may differ from the embodiments illustrated in FIG. 7.

While various embodiments have been described above, it will be understood to those skilled in the art that the embodiments described are by way of example only. Accordingly, the delay adjusting apparatus and the operating apparatus including the same described herein should not be limited based on the described embodiments.

What is claimed is:

1. A delay adjusting apparatus comprising:
   at least one selective delay element electrically coupled to an electrical path between an input terminal and an output terminal of the electrical path, and the at least one selective delay element configured to control electrical coupling of an electrical delay element to the electrical path in response to a logic state of an enable signal; and
   at least one fuse circuit configured to control electrical coupling of an e-fuse, in response to a program signal, and program the enable signal.

2. The delay adjusting apparatus according to claim 1, wherein the program signal is received from exteriorly from the delay adjusting apparatus.

3. The delay adjusting apparatus according to claim 1, wherein the selective delay element is configured to control electrical coupling of a capacitor component to the electrical path in response to the enable signal.

4. The delay adjusting apparatus according to claim 3, wherein the fuse circuit comprises:

a path control unit electrically coupled between a programming unit and a latch unit and configured to control electrical coupling of a path between the programming unit and the latch unit, based on a path signal; and the programming unit configured to apply a first voltage and a second voltage to both terminals of the e-fuse in response to a rupture enable signal, and rupture the e-fuse, wherein the path signal and the rupture enable signal is included in the program signal.

5. The delay adjusting apparatus according to claim 4, wherein the latch unit is configured to receive an electric signal through the path control unit from the programming unit, and to provide the enable signal.

6. The delay adjusting apparatus according to claim 5, wherein the programming unit comprises:

a switching element configured to provide the first voltage to a terminal of the e-fuse in response to the rupture enable signal; and the e-fuse electrically coupled with the second voltage through another terminal.

7. The delay adjusting apparatus according to claim 6, wherein the switching element includes a PMOS transistor coupled between the first voltage and the terminal of the e-fuse and including a gate configured for receiving the rupture enable signal.

8. The delay adjusting apparatus according to claim 6, wherein the path control unit electrically couples the terminal of the e-fuse and the latch unit.

9. The delay adjusting apparatus according to claim 6, wherein the programming unit programs the e-fuse according to an electric field based on the first voltage and the second voltage, in response to the rupture enable signal.

10. An operating apparatus comprising:

at least one delay adjusting apparatus configured to control electrical coupling of an e-fuse, based on a program signal, and program an enable signal, and adjust a delay time of an input signal in response to the programmed enable signal and output an output signal; and a program control circuit configured to generate the program signal to adjust the delay time, wherein the delay adjusting apparatus comprises:

at least one selective delay element electrically coupled to an electrical path electrically coupled between the input signal and the output signal of the at least one delay adjusting apparatus, and configured to control electrical coupling of an electrical delay element to the electrical path in response to a logic state of the enable signal; and at least one fuse circuit configured to control electrical coupling of the e-fuse, in response to the program signal, and program the enable signal.

11. The operating apparatus according to claim 10, wherein one delay adjusting apparatus is realized on one die.

12. The operating apparatus according to claim 11, wherein the fuse circuit comprises:

a path control unit electrically coupled between a programming unit and a latch unit and configured to control electrical coupling of a path between the programming unit and the latch unit, based on a path signal;

the programming unit configured to apply a first voltage and a second voltage to both terminals of the e-fuse in response to a rupture enable signal; and the latch unit configured to receive an electric signal through the path control unit from the programming unit, and to provide the enable signal, and wherein the path signal and the rupture enable signal is included in the program signal.

13. The operating apparatus according to claim 12, wherein the program control circuit provides the first voltage and the second voltage by increasing a difference between the first voltage and the second voltage, after electrically coupling and then decoupling the path between the programming unit and the latch unit, based on the path signal.

14. The operating apparatus according to claim 13, wherein the program control circuit is configured to generate the path signal such that the path control unit electrically couples the path between the programming unit and the latch unit, and disables the rupture enable signal, during a normal operation.

15. The operating apparatus according to claim 12, wherein the programming unit comprises:

a switching element configured to provide the first voltage to a terminal of the e-fuse in response to the rupture enable signal; and the e-fuse electrically coupled with the second voltage through another terminal.

16. The operating apparatus according to claim 11, wherein the operating apparatus includes a plurality of delay adjusting apparatuses realized in a plurality of dies, the plurality of delay adjusting apparatuses packaged into one package, and the program control circuit configured to operate to program the enable signal according to a characteristic of the package.

* * * * *